United States Patent [19]

McGinness

[11] 4,255,469
[45] Mar. 10, 1981

[54] PROCESS FOR SELECTIVELY APPLYING A CONFORMAL COATING WITH A MASKING TAPE HAVING AN IMBEDDED WIRE CUTTING EDGE

[75] Inventor: Patrick J. McGinness, Redondo Beach, Calif.

[73] Assignee: Hughes Aircraft Company, Culver City, Calif.

[21] Appl. No.: 54,360

[22] Filed: Jul. 2, 1979

Related U.S. Application Data

[62] Division of Ser. No. 950,210, Oct. 10, 1978, abandoned.

[51] Int. Cl.³ .............................................. B05D 1/32
[52] U.S. Cl. ..................................... 427/282; 156/247
[58] Field of Search ............... 206/616, 617; 427/264, 427/272, 282; 428/192, 292, 295, 345; 118/505; 156/247

[56] References Cited

U.S. PATENT DOCUMENTS

| | | | |
|---|---|---|---|
| 1,922,565 | 8/1933 | Adair | 206/616 |
| 2,005,665 | 6/1935 | Saignier | 206/617 |
| 2,636,835 | 4/1953 | Boulware et al. | 428/292 X |
| 2,771,385 | 11/1956 | Humphner | 206/616 |
| 2,808,358 | 10/1957 | Masse | 156/247 |
| 2,895,865 | 7/1959 | Humphner | 428/343 X |
| 3,130,078 | 4/1964 | Lewis et al. | 118/505 |
| 3,138,850 | 6/1964 | Laro et al. | 427/282 |
| 3,684,602 | 8/1972 | Ball | 156/247 |
| 4,033,358 | 7/1977 | Harrington | 131/260 X |

Primary Examiner—Ronald H. Smith
Assistant Examiner—Janyce A. Bell
Attorney, Agent, or Firm—Lewis B. Sternfels; W. H. MacAllister

[57] ABSTRACT

A process for masking an electronic module with a masking tape having an imbedded wire utilized as a cutting edge. The wire is adhered along the edge of the masking tape and the tape is applied to the module so that the wire separates the area to be coated from the area to be coating free. A conformal coating is then applied to the module. After the conformal coating has dried the wire cutting edge is pulled from the tape so as to cut a smooth edge through the conformal coating. The tape is then removed leaving the area underneath free of the coating.

2 Claims, 8 Drawing Figures

PROCESS FOR SELECTIVELY APPLYING A CONFORMAL COATING WITH A MASKING TAPE HAVING AN IMBEDDED WIRE CUTTING EDGE

This is a division of application Ser. No. 950,210 filed Oct. 10, 1978 now abandoned.

FIELD OF THE INVENTION

The invention relates generally to masking tape and in particular to an easily removable masking tape.

PRIOR ART

Printed circuit boards and modules are sensitive to many environmental effects. They must generally be protected from the harmful effects of a hostile environment, which may include airborne contaminants, moisture, salt spray, and corrosive vapors. Any one of these is harmful enough to damage circuitry which is costly to repair or replace. To protect these delicate electronic components from a harsh environment a thin, supple coating is applied to the circuit boards and circuit paths.

An assortment of techniques has been devised to cover the circuitry with a protective coating, commonly called a conformal coating, which is impervious to certain environments. These coatings may have a thickness of 0.0005 to 0.005 inch, depending upon the type of coating. However, by eliminating the central concern, i.e., a hostile environment, several other problems may be created. It may be seen below how the present invention overcomes these problems.

Engineering designs usually specify that some components or circuit areas be left exposed. For fast, cost-effective mass production the coating must be applied by machine. Available tooling, however, is unable to selectively coat only certain areas. Therefore masking methods were introduced.

Unfortunately, masking methods are not mechanized. Tapes, plugs, caps and elastic moldings are tediously applied by hand as are all other maskants presently available. Also, all maskants must be removed after the work piece is coated. Usually the removal is also by hand. In order to remove some of these maskants it is frequently necessary to cut them away using razor sharp cutting blades. Use of such razor sharp blades requires a skill which takes training and, notwithstanding one's skill, it is still risky. The penetration of the blade through the coating must be exactly controlled otherwise delicate circuitry would be damaged.

In certain instances, the masking tape itself has been used to break the conformal coating. Unfortunately, this is not a satisfactory method. As is obvious, masking tapes are soft and plyable and therefore do not have good cutting edges. This results in the conformal coating being either lifted from the board surface or leaving a very ragged edge where the masking tape was pulled from the coating. If the conformal coating is pulled away from the board, the circuitry and components are exposed to the environment. Similarly, if the conformal coating has a ragged edge, moisture and other contaminants tend to gather there and thus damage the board.

There are various materials and methods used for coating printed circuit boards. The materials include polyurethane, acrylics, silicones and parylene. Polyurethane, acrylics and silicones may be applied by brushing, spraying or dipping the part in the coating solution. Depending upon the type and severity of the environment, one of the above mentioned coating materials would be used. The thickness of the conformal coating is determined by the environment and coating material.

There is a product presently on the market called Parylene which is applied by vacuum deposition only. Parylene is a linear plastic polymer, and is available from Union Carbide. The exact deposition process is not the subject of the present invention and this material is only mentioned to specifically point out certain needs and problems therefore; of the process. In the deposition of Parylene, the entire work piece is coated, except for the area under the masking tape. In order to remove the masking tape, it is necessary first to cut the tape through the conformal coating along the edge with a very sharp blade and then lift the tape away. Although the coating has superior protection properties, its adhesion to the work surface, combined with its tensile strength, prevents the mere lifting of the tape to remove it, as is the case in other coating materials. The requirement of cutting away the masking tape itself poses certain additional problems. For example, many circuit paths are very delicate and are easily broken by a sharp knife in a heavy hand. To protect against such inadvertent damaging, the technician must be extremely careful in cutting the tape away. Thus, more time is required to safely remove the tape. The use of the present invention in conjunction with the Parylene process would obviate the problems and save time and money.

SUMMARY OF THE INVENTION

In accordance with the foregoing, it is an object of the present invention to provide a new type of tape which provides for quick, easy and economical removal.

It is another object of the present invention to provide a masking tape having a built-in means for facilitating the removal of the tape.

It is still another object of the present invention to provide an easily removable tape for preventing damage to circuit boards.

Accordingly, an improved masking process includes utilizing a tape having a wire disposed along one surface. The process includes the steps of masking selected areas of a module with tape having a fine wire, such that the fine wire separates the area to be coated from the area to remain exposed; coating the module; separating the wire from the tape thereby cutting through the conformal coating; and removing the tape.

DETAILED DESCRIPTION OF THE DRAWINGS

Figure 1:
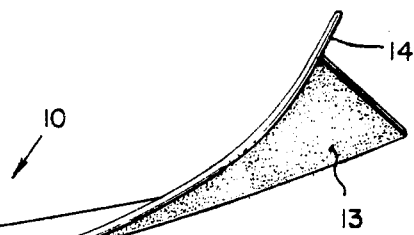
FIG. 1 is a perspective view of the present invention.

The present invention 10 is best illustrated by FIG. 1 which depicts a strip of tape 12 having a fine wire 14 attached to the adhesive side 13 of the tape 12. The adhesive tape 12 may be any one of a number of adhesive tapes which are suitable for use as masking type tapes in conjunction with conformal coatings. For instance, a polyester tape, such as Mylar ® tape, may be utilized since it adheres well to circuit boards and conforms to the surface being covered and is of sufficient strength to be lifted therefrom, once it has been coated. In addition, Mylar tape does not lift around edges. A fluorocarbon tape, such as Teflon ® tape, is also a suitable tape since in addition to the properties of Mylar ®, it also conforms well to uneven surfaces such as are presented by circuit boards. Also, Teflon will not lift away from the boards when being coated. The wire 12 may also be disposed along the uncoated side of the tape material. However, for purposes of low cost production, the wire is placed along the adhesive side. There are certain paper base masking tapes which would be suitable to use with the present invention.

The wire which may be used in practicing the invention is one of a number of suitable wires. The best wire may be an elastic synthetic material such as a thin monofilament nylon wire having a diameter of 0.005 inch, for example. Other diameters and materials may serve equally well. A more detailed discussion concerning nylon wire may be found below in the discussion of FIG. 7.

Other suitable wires may be metal wire made of stainless steel or copper, for example. Although, metallic wires are not as flexible as nylon or similar wires, they are strong. Metal wires are not as desirable to use as nylon, for example, since one must exercise greater care when working with these since they tend to be sharp and could inflict cuts.

The wire 14 may be attached to the adhesive side 13 of the tape 12 by inbedment into the adhesive side 13 or by any appropriate method. The particular method used is not the subject of the present invention and therefore will not be discussed in detail.

Figure 2:
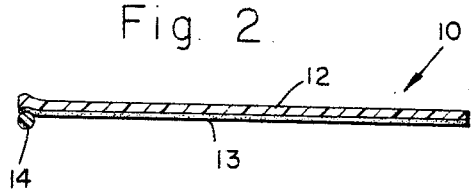
FIG. 2 is an edge view of the present invention.

Referring now to FIG. 2, the invention is illustrated by an end view of the tape-and-wire combination. This figure demonstrates the preferred position of the wire 14 with respect to the edge of the tape 12. Although the wire 14 is shown at the very edge of the tape 12, it may be a small distance, i.e., up to 0.060 inch, from the edge and parallel with the edge.

Figure 3:
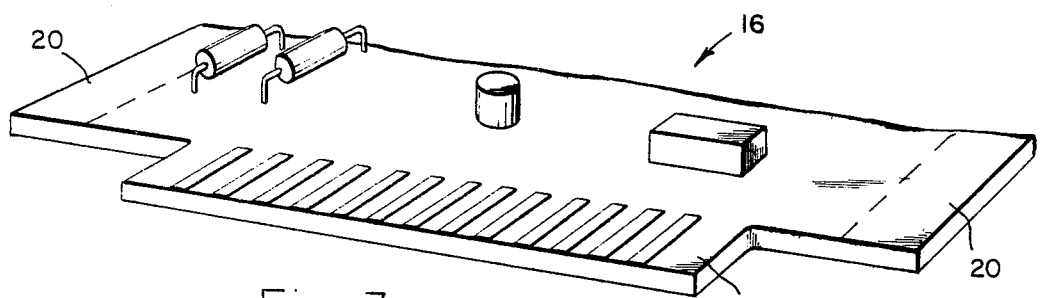
FIG. 3 is a perspective view of a printed circuit board.

Referring now to FIG. 3, a perspective view illustrates a printed circuit board 16 which is to be covered with a conformal coating, but having several areas which must remain exposed for various reasons. For example, the areas designated 20 must remain uncoated because these must slide through connector rails and may also be utilized for making an electrical ground connection. The area designated as 21 must remain uncoated because this printed circuitry forms a male electrical connector which is inserted into a female counterpart.

Figure 4:
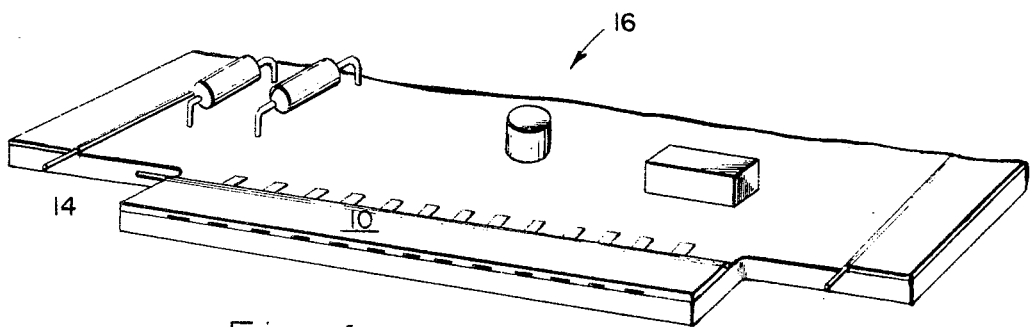
FIG. 4 is a perspective view of a printed circuit board having selected areas covered by tape according to the present invention.

FIG. 4 illustrates the placement of the wire-imbedded tape 10 being placed along the areas to remain free of the conformal coating. It is noted that the tape is oriented such that the wire 14 forms the boundary between the areas to be coated and the areas to remain uncoated.

Figure 5:
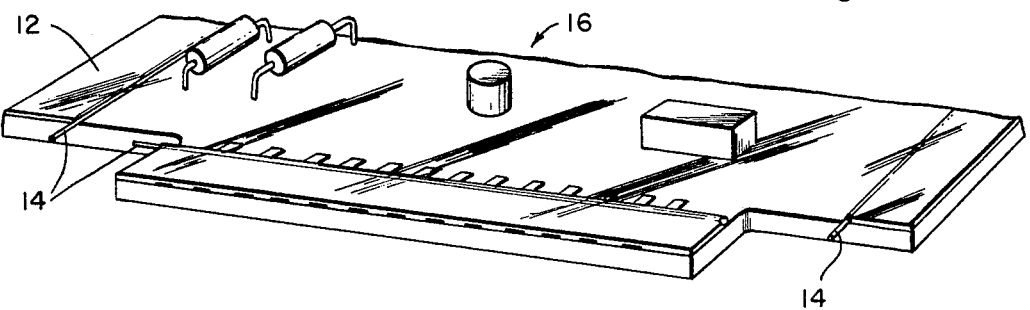
FIG. 5 is a perspective view of a masked printed circuit board being coated with a conformal coating.

After all the necessary areas are covered with masking tape, the entire board is coated with a suitable conformal coating 17 as illustrated in FIG. 5. As noted above, the coating may be applied by spraying, brushing, dipping or vacuum deposition depending upon the particular coating and the thickness desired. The entire board may be coated, even the masked areas 20 and 21.

Figure 6:
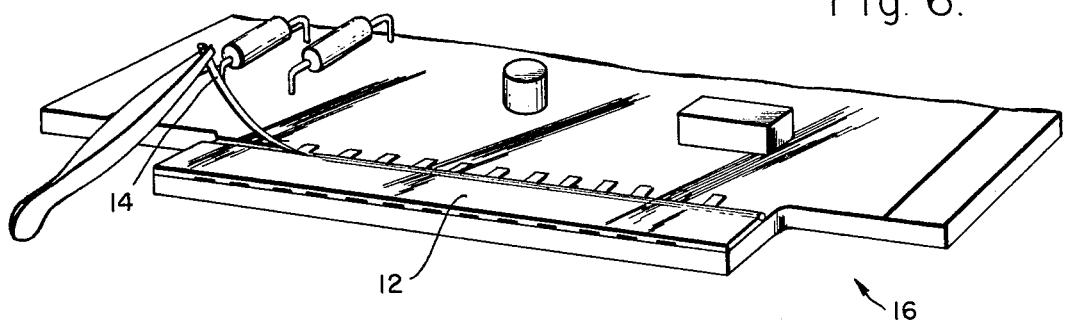
FIG. 6 is a perspective view of the conformal coating of a coated printed circuit board being pierced by the masking tape wire.

Once the conformal coating has cooled and somewhat hardened, one end of the wire 14 may be pulled through the conformal coating 24 with a pair of tweezers, as illustrated in FIG. 6. As the wire is pulled away from the tape 12, it forms a relatively sharp edge which then cuts through the conformal coating like a knife blade from underneath. Generally, a very clean and straight edge is left on the conformal coating 24 as the wire 14 cuts through.

Figure 7:
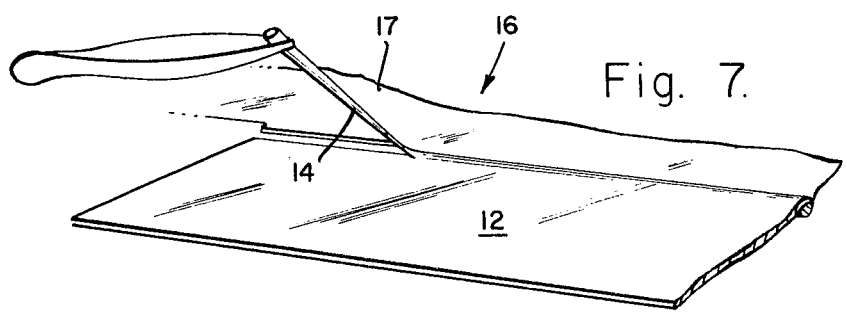
FIG. 7 is an exploded view of a monofilament nylon wire severing the conformal coating.

FIG. 7 is an enlargement depicting the wire being pulled through and cutting the conformal coating 24. The wire 14 illustrated herein is a monofilament nylon wire. As the wire is pulled, it stretches to a certain extent, thereby reducing the diameter as it pulls through the coating. As the diameter is reduced, a sharper cutting edge is formed such that the wire cuts through the coating easily. Monofilament nylon is usually of sufficient strength that it does not break in the cutting operation. The wire's action provides a fine, clean break in the conformal coating. As discussed above, a metal wire may also be used but should have a smaller diameter since it is not as elastic as the monofilament wire and its diameter does not easily reduce.

Figure 8:
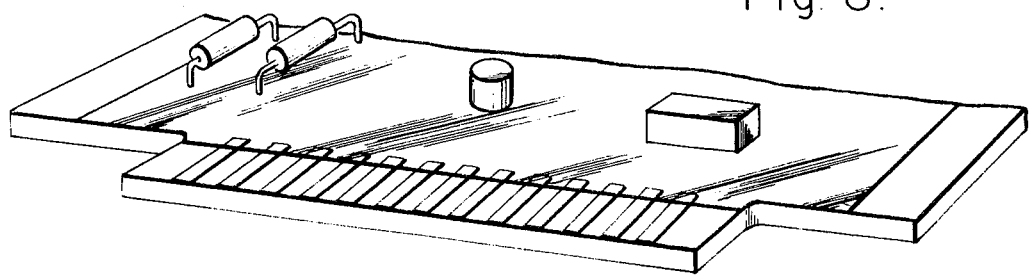
FIG. 8 is a perspective view of the masking tape after being removed from the area of the printed circuit board to be exposed.

After the wire has been completely removed, there is a clean separation or break in the conformal coating between the taped area and the coated area. FIG. 8 now depicts the removal of the masking tape 12 from area 21, thereby leaving the connector circuitry exposed. Thus, it is clear that delicate circuitry need not be risked by cutting through the conformal coating with sharp blades with the danger of cutting through the circuitry also. The masked area is more readily exposed merely by cutting through the conformal coating with the wire and then peeling away the tape. This operation requires much less time and skill than cutting the conformal coating with a blade.

Although the invention has been shown and described with respect to particular embodiments, nonetheless changes and modifications by one skilled in the art to which the present invention pertains are deemed within the purview of the present invention.

What is claimed is:

1. A process of coating only a selected area of a workpiece while leaving an adjacent area coating free, comprising the steps of:
    masking the adjacent area of the workpiece with a tape having a wire along an edge thereof, and placing the wire on the boundary between the areas;
    applying a coating over the workpiece and the tape;
    lifting the wire to sever the coating along the boundary; and
    removing the tape from the adjacent area.
2. A process according to claim 1 wherein said masking step includes the step of adhering the tape to the selected area.

* * * * *